(12) United States Patent
Kim et al.

(10) Patent No.: US 7,180,783 B2
(45) Date of Patent: Feb. 20, 2007

(54) NON-VOLATILE MEMORY DEVICES THAT INCLUDE A PROGRAMMING VERIFICATION FUNCTION

(75) Inventors: In-Young Kim, Seoul (KR); June Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/025,859

(22) Filed: Dec. 29, 2004

(65) Prior Publication Data
US 2005/0162918 A1     Jul. 28, 2005

(30) Foreign Application Priority Data
Jan. 2, 2004     (KR) .................. 10-2004-0000023

(51) Int. Cl.
*G11C 11/34*     (2006.01)
(52) U.S. Cl. .................. 365/185.22; 365/238.5; 365/189.05; 365/189.12; 365/189.08
(58) Field of Classification Search ........... 365/185.22, 365/238.5, 189.05, 189.12, 189.08
See application file for complete search history.

(56) References Cited
U.S. PATENT DOCUMENTS
6,625,063 B2 * 9/2003 Kim ..................... 365/185.28

| | | | |
|---|---|---|---|
| 6,922,364 B2 * | 7/2005 | Kojima | 365/185.33 |
| 6,999,347 B2 * | 2/2006 | Mitani | 365/185.22 |
| 2003/0016562 A1 * | 1/2003 | Im | 365/189.02 |

FOREIGN PATENT DOCUMENTS

| KR | 1020020043378 A | 6/2002 |
|---|---|---|
| KR | 1020030051402 A | 6/2003 |

* cited by examiner

*Primary Examiner*—Richard Elms
*Assistant Examiner*—N Nguyen
(74) *Attorney, Agent, or Firm*—Meyers Bigel Sibley & Sajovec, PA

(57) ABSTRACT

A non-volatile semiconductor memory device includes a cell array including a plurality of memory cells arranged in a plurality of rows and columns. A page buffer circuit includes a plurality of page buffers corresponding to the plurality of columns, respectively, each page buffer including a first register that is configured to store programming data for a page memory cells and a second register that is configured to store contents of the first register and outside input data. A pass/fail check circuit is configured to generate a programming verification result for the pages of memory cells responsive to the contents of the first registers. A pass/fail check latch circuit is configured to store the programming verification result.

14 Claims, 7 Drawing Sheets

NON-VOLATILE MEMORY DEVICES THAT INCLUDE A PROGRAMMING VERIFICATION FUNCTION

CROSS REFERENCE TO RELATED APPLICATION

This application claims the priority of and priority to Korean Patent Application No. 2004-00023, filed on Jan. 2, 2004, the disclosure of which is hereby incorporated by reference as if set forth in its entirety.

FIELD OF THE INVENTION

The invention relates to integrated circuit memory devices and methods of operating the same, and more particularly, to non-volatile integrated circuit memory devices and methods of operating the same.

BACKGROUND

Flash memories have been widely used as digital storage media in digital cell phones, digital cameras, MP3 players etc. Flash memories are devices for which the contents can be erased or programmed by a block or page unit.

FIG. 1 illustrates an architecture of a conventional flash memory device. As shown in FIG. 1, a flash memory includes a memory cell array for storing data information. The cell array includes a plurality of NAND or cell strings, which are connected to bit lines, respectively. As is well known, a NAND string comprises a string select transistor connected to a bit line, a ground select transistor connected to a common source line, and memory cell transistors connected in series between select transistors. Each of the memory cell transistors is controlled by corresponding word lines.

The flash memory further includes a control circuit, an address buffer, a data input/output buffer, a column decoder, a row decoder and a page buffer circuit. The control circuit controls various operations of the memory cell array. The data buffer circuit temporarily stores data input from the outside or output through the memory cell array and the page buffer.

The address buffer circuit latches column and row addresses provided to input/output pins depending on a control of the control circuit. The latched row and column addresses are respectively transferred to the column and row decoder circuits.

The column decoder circuit selects one of bit lines in response to an input address. The row decoder circuit selects one of word lines in response to the input address and provides word line power to selected and non-selected word lines, respectively.

As is generally known, page buffer circuits perform various functions according to an operation mode. For example, page buffer circuits read output data from memory cells of a selected word line during a read operation. Page buffer circuits provide a program voltage or a program inhibit voltage to bit lines according to the states of data to be programmed during a program operation.

However, a verification check is typically performed to determine whether the program operation was successfully performed. If data to be programmed is successfully stored in the memory cell array, this means that the program operation "passed." If data to be programmed is not successfully stored in the memory cell array, this means that the program operation "failed."

A semiconductor memory device capable of checking pass/fail status is disclosed in Korean Laid-Open publication No. 10-2003-0061877. FIG. 2 illustrates the architecture of the semiconductor memory device disclosed in the Korean Laid-Open Publication. Referring now to FIG. 2, a conventional semiconductor memory device capable of checking pass/fail status comprises a cell array 10, a page buffer circuit 20, and a pass/fail check circuit 30 for outputting a verification result of a program operation with respect to page data using a signal output from the page buffer circuit 20.

The semiconductor memory device shown in FIG. 2 has a pass/fail check function. According to this function, in advance, a verify read operation is performed by means of the page buffer. Data nWD0 read out by the page buffer is transferred to the pass/fail check circuit 30 so as to check whether a program operation has been successfully performed.

The pass/fail check circuit 30 includes a latch LAT1 comprising a NMOS transistor M1, an inverter INV1, and two inverters INV2 and INV3. The pass/fail check circuit 30 checks whether the data nWD0 has the same values (e.g., a pass data value) or not. If the data has the same values, for example, the present program operation is considered to be successfully performed.

The above-mentioned nonvolatile memory device only checks the pass/fail status of a programming page. Accordingly, when two or more pages are successively programmed, then the pass/fail status with respect to pages other than the programming page may not be checked.

SUMMARY

According to some embodiments of the present invention, a non-volatile semiconductor memory device includes a cell array including a plurality of memory cells arranged in a plurality of rows and columns. A page buffer circuit includes a plurality of page buffers corresponding to the plurality of columns, respectively, each page buffer including a first register that is configured to store programming data for a page memory cells and a second register that is configured to store contents of the first register and outside input data. A pass/fail check circuit is configured to generate a programming verification result for the pages of memory cells responsive to the contents of the first registers. A pass/fail check latch circuit is configured to store the programming verification result.

In other embodiments of the present invention, each of the page buffers further comprises an insulated switch for selectively isolating the first and second registers. Each of the first and second registers comprises a latch configured to store data and a precharge circuit configured to precharge the register.

In still other embodiments of the present invention, the pass/fail check latch circuit comprises a first check latch configured to store the programming verification result with respect to k-numbered page of memory cells (where, k=1, 2, . . . , n). A second check latch is configured to store the programming verification result with respect to the k-1-numbered page of memory cells. A third check latch is configured to detect whether a page has been unsuccessfully programmed based on the programming verification result for that page stored in the first check latch. If a page has been detected as having been unsuccessfully programmed once, then the third check latch maintains a "fail" state value until a successful program operation is performed with respect to all n pages.

In still other embodiments of the present invention, the first check latch comprises a first inverter configured to receive an output signal of the pass/fail check circuit. A first NOR gate is configured to receive an output signal of the first inverter and a control signal. A second NOR gate is configured to receive the output signal of the pass/fail check circuit and the control signal. A third NOR gate is configured to receive an output signal of the second NOR gate and a reset signal. A second inverter is configured to receive an output of the third NOR gate. A latch circuit is configured to receive outputs of the first NOR gate and the second inverter.

In still other embodiments of the present invention, the latch circuit comprises two cross-coupled NOR gates.

In still other embodiments of the present invention, the second check latch comprises a first inverter configured to receive an output signal of the first check latch. A first NOR gate is configured to receive an output signal of the first inverter and a control signal. A OR gate is configured to receive an output signal of the first check latch and the control signal. A second inverter is configured to receive a reset signal. A NAND gate is configured to receive output signals of the OR gate and the second inverter. A latch circuit is configured to receive outputs of the NOR gate and the NAND gate.

In still other embodiments of the present invention, the latch circuit comprises two cross-coupled NOR gates.

In still other embodiments of the present invention, the third check latch comprises an inverter configured to receive an output signal of the first check latch. A NOR gate is configured to receive an output signal of the inverter and a control signal. A latch circuit is configured to receive an output of the NOR gate and the reset signal.

In still other embodiments of the present invention, the latch circuit comprises two cross-coupled NOR gates.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
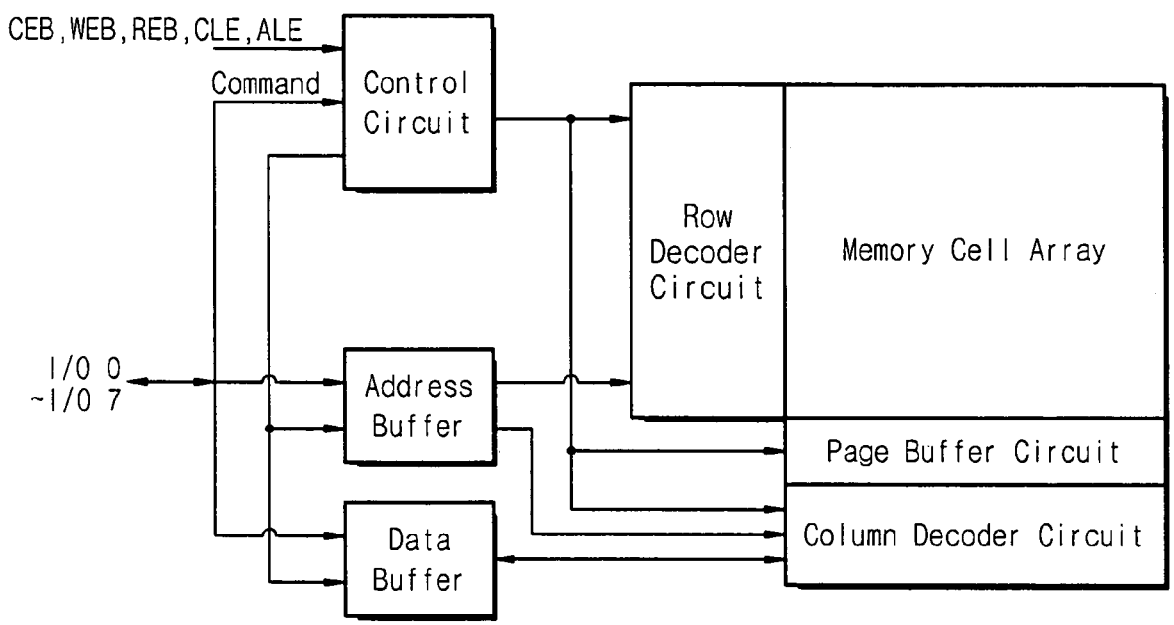
FIG. 1 illustrates an architecture of a conventional flash memory device.
Figure 2:
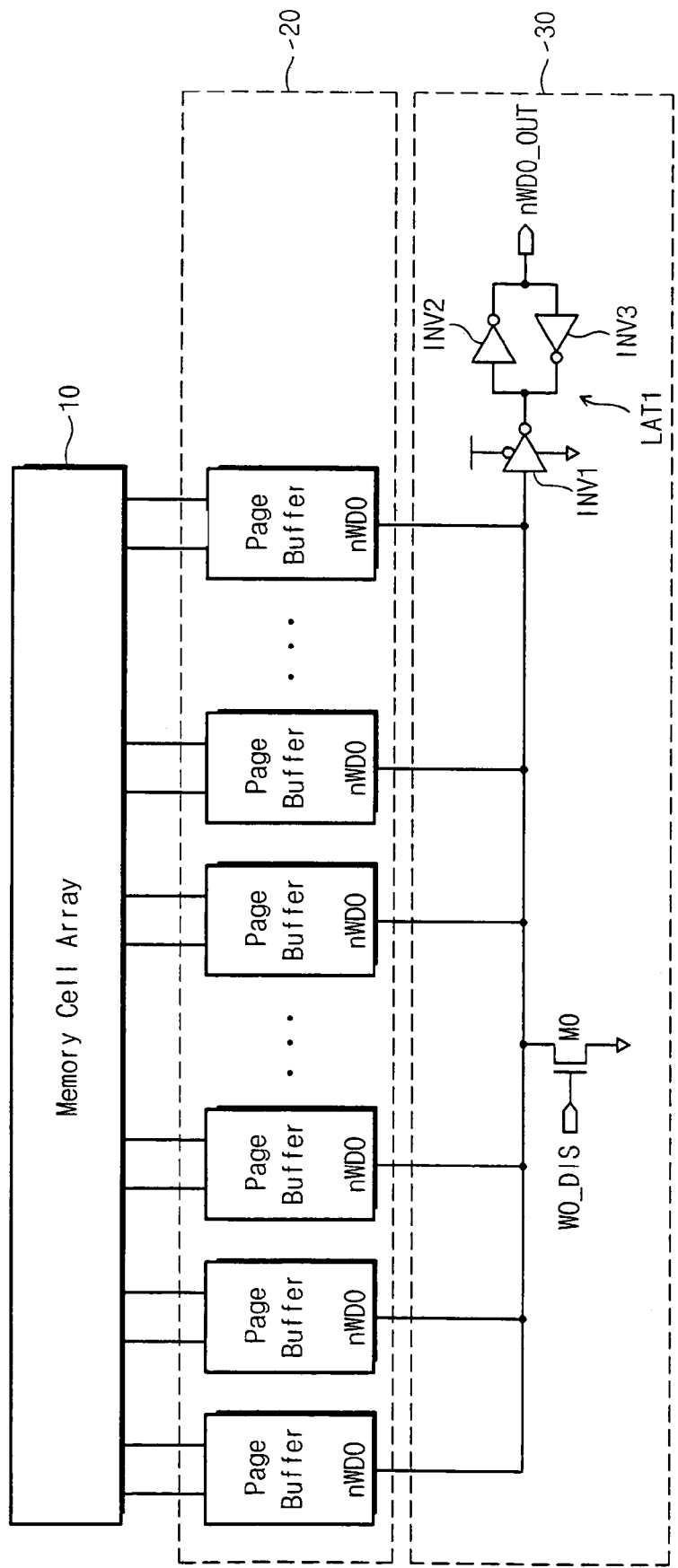
FIG. 2 illustrates a conventional semiconductor memory device that includes a programming pass/fail check function.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
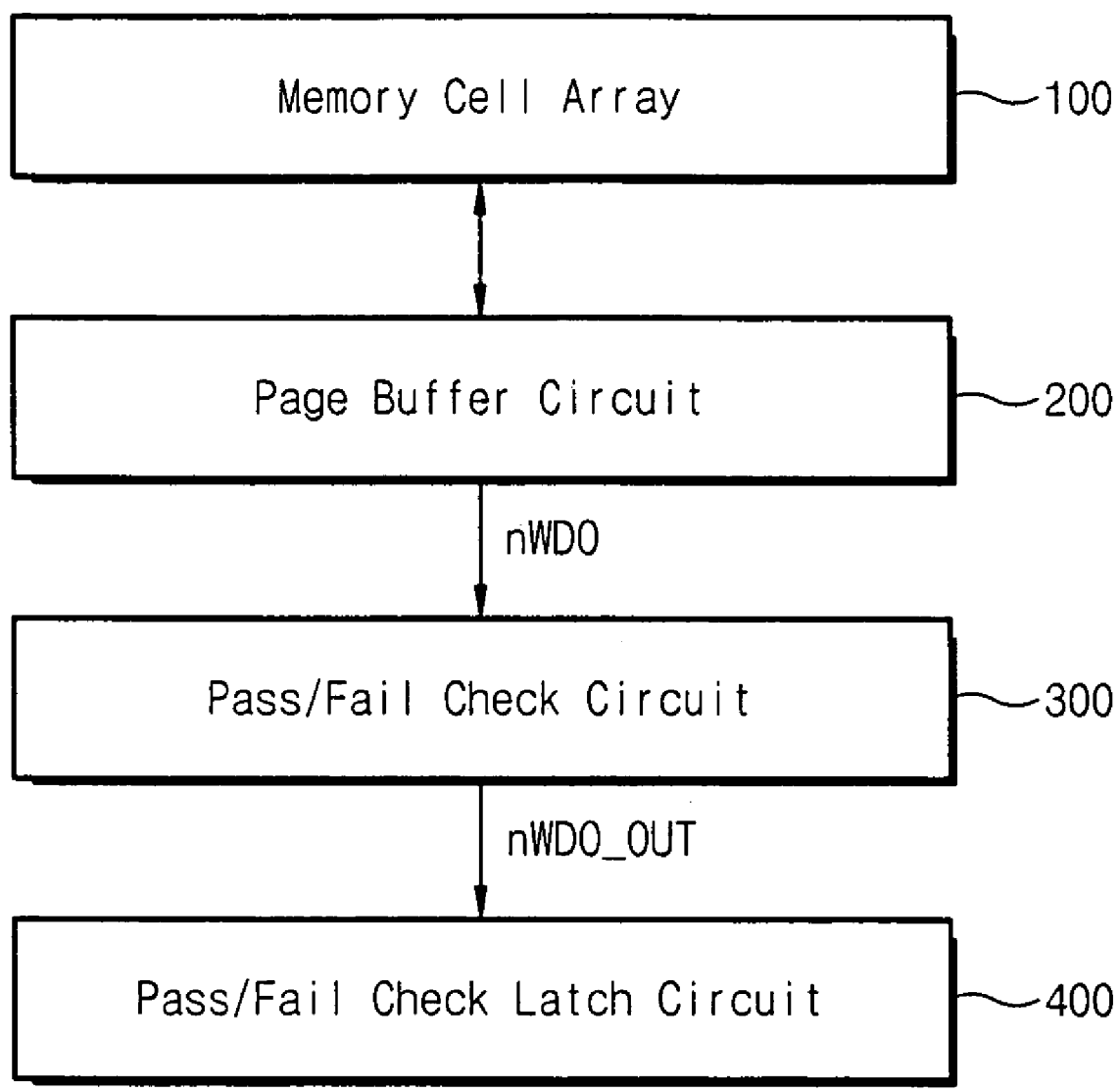
FIG. 3 illustrates an architecture of a pass/fail check circuit for a non-volatile memory device according to some embodiments of the present invention.
Figure 4:
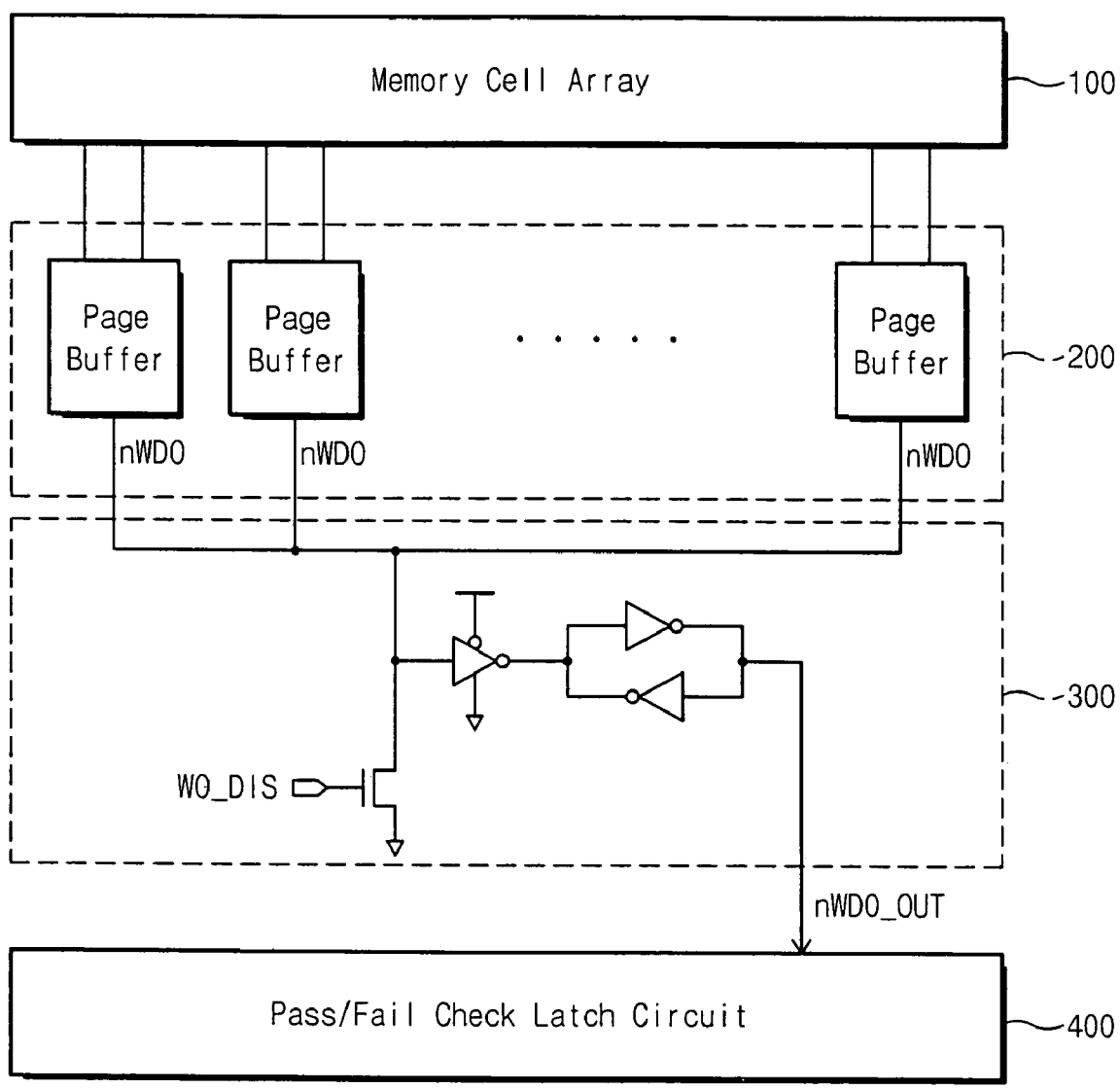
FIG. 4 illustrates architectures of a page buffer circuit and a pass/fail check circuit, which are shown in FIG. 3, in accordance with some embodiments of the present invention.

FIG. 3 illustrates an architecture of a pass/fail check circuit for a nonvolatile memory device according to some embodiments of the present invention. FIG. 4 illustrates architectures of a page buffer circuit and a pass/fail check circuit, which are shown in FIG. 3.

Referring now to FIG. 3, the pass/fail check circuit comprises a memory cell array 100, a page buffer circuit 200, a pass/fail check circuit 300; and a pass/fail check latch circuit 400. The memory cell array 100 includes a plurality of memory cells arranged in a matrix format of a plurality of rows and columns. Data is stored in the memory cells.

Referring now to FIG. 4, the page buffer circuit 200 comprises several page buffers. Each of the page buffer outputs a control signal nWD0. The control signal nWD0 is a signal that indicates a verification result with respect to whether data in each of the pages is successfully programmed or not programmed.

The pass/fail check circuit 300 is a wired OR circuit that checks whether the control signals nWD0 have the same values (e.g., a pass data value) or not. If the control signals nWD0 have the same value, then the present program operation is determined to be successfully performed. The pass/fail check circuit 300 comprises a NMOS transistor, an inverter, and a latch, which are connected as shown in FIG. 4.

Figure 5:
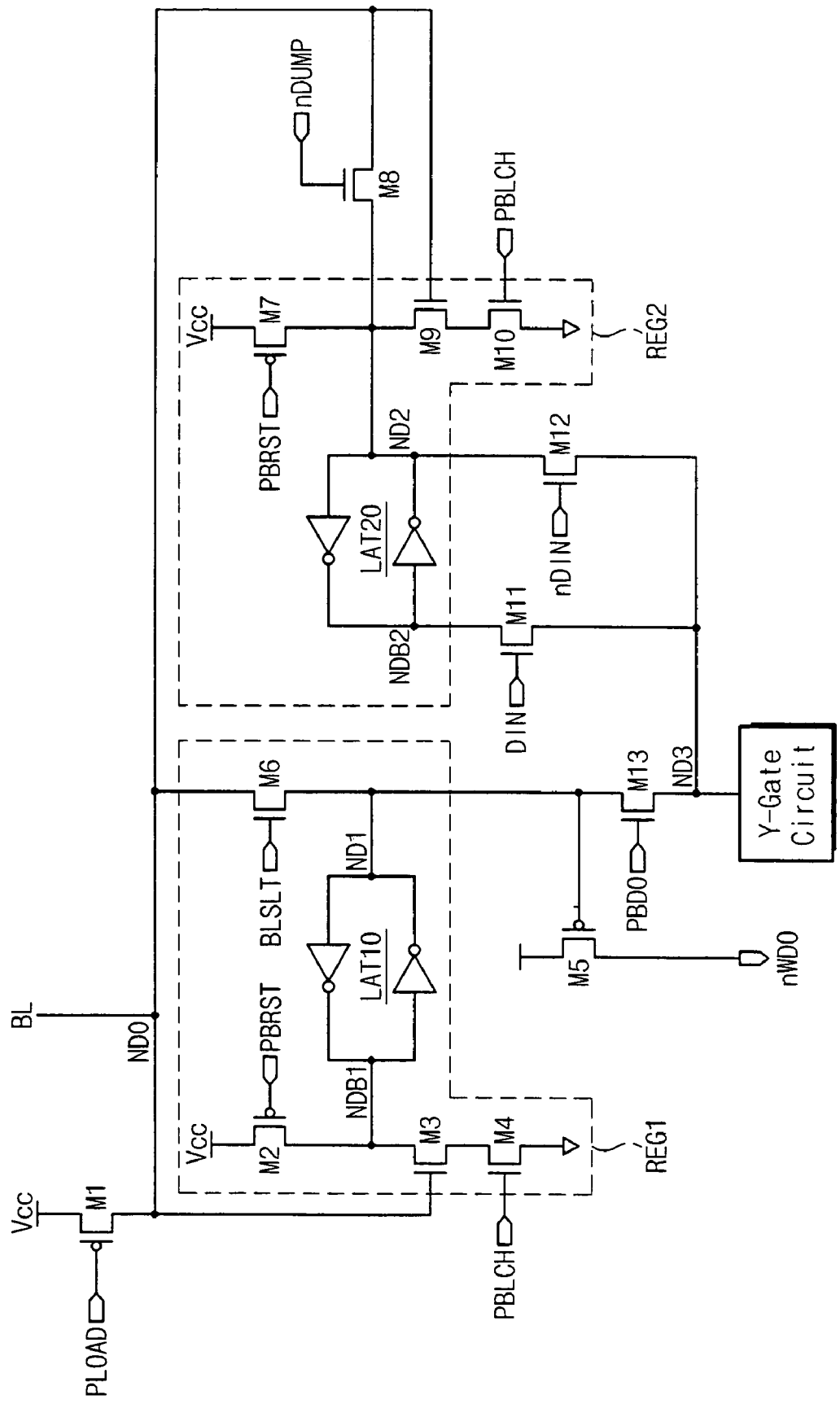
FIG. 5 illustrates a schematic of the page buffer of FIG. 4 according to some embodiments of the present invention.

FIG. 5 illustrates a schematic of the page buffer of FIG. 4 according to some embodiments of the present invention. As shown in FIG. 5, each of the page buffer blocks includes a first register REG1 and a second register REG2. The first register is used by programming data at each of a group of memory cells. The second register is used to store data input from the outside. The page buffer is connected to a bit line BL. A PMOS transistor M1 is connected between a power voltage VCC and a sense node ND0. The PMOS transistor M1 is controlled by a control signal PLOAD. The page buffer includes first and second latches LAT 10 and LAT20. The first latch LAT10 comprises inverters INV11 and INV12, and first and second latch nodes ND1 and NDB1. The second latch LAT20 comprises inverters INV21 and INV22, and first and second latch nodes ND2 and NDB2. A PMOS transistor M2 is connected between the power voltage VCC and the second latch node NDB1 of the first latch LAT10. The PMOS transistor M2 is controlled by a control signal PBRST. NMOS transistors M3 and M4 are connected in series between the second latch node NDB1 and a ground voltage VSS. The NMOS transistors M3 and M4 are controlled by a voltage level of a sense node ND0 and a control signal PBLCH, respectively. A PMOS transistor M5 is connected between the power voltage VCC and a nWD0 terminal, and is turned on/off depending on a logic state of the first latch node ND1. The nWD0 terminal is electrically connected to the wired OR circuit (see FIG. 4). A logic level of the nWD0 terminal is complementary to the first latch node ND1. For example, if the first latch node ND1 has a low level, then the nWD0 node is electrically connected to the power voltage VCC so as to have a high level. If the first latch node ND1 has a high level, then the nWD0 node is electrically separated from the power voltage VCC so as to have a floating state.

Still referring to FIG. 5, a NMOS transistor M6 is turned on/off based on a control signal BLSLT and is connected between the sense node ND0 and the first latch node ND1 of the first latch LAT10. A NMOS transistor M13 is connected between an internal node ND3 and the first latch node ND1, and is turned on/off based on a control signal PBD0.

A PMOS transistor M7 is connected between the power voltage VCC and the first latch node ND2 of the second latch LAT20. A NMOS transistor M8 is connected between the first latch node ND2 and the sense node ND0, and is controlled by a control signal nDUMP. NMOS transistors M9 and M10 are connected in series between the first latch node ND2 and the ground voltage VSS. A NMOS transistor M9 is controlled by a logic state of the sense node ND0, and A NMOS transistor M10 is controlled by a control signal PBLCH.

A NMOS transistor M11 is connected between a second latch node NDB2 of the second latch LAT20 and an internal node ND3. A NMOS transistor M12 is connected between the first latch node of the second latch LAT20 and an internal node ND3. NMOS transistors M11 and M12 are controlled by data signals DIN and nDIN having a complementary level, respectively.

If a program data bit to be loaded to the page buffer is "1," for example, the data signal DIN is logically high, and the data signal nDIN is logically low. The internal node ND3 is connected to a data line by a Y-gating circuit.

As discussed above, the nWD0 signal is determined based on a logic state of the first latch node ND1 of the first latch LAT10. For example, if the first latch node ND1 has a high level of "1," then the PMOS transistor M5 is turned off. If the first latch node ND1 has a low level of "0," then the PMOS transistor M5 is turned on. In this case, the high level of the first latch node ND1 means that a corresponding memory cell has been successfully programmed/erased. The low level of the first latch node ND1 means that the corresponding memory cell has not been sufficiently programmed/erased.

Figure 6:
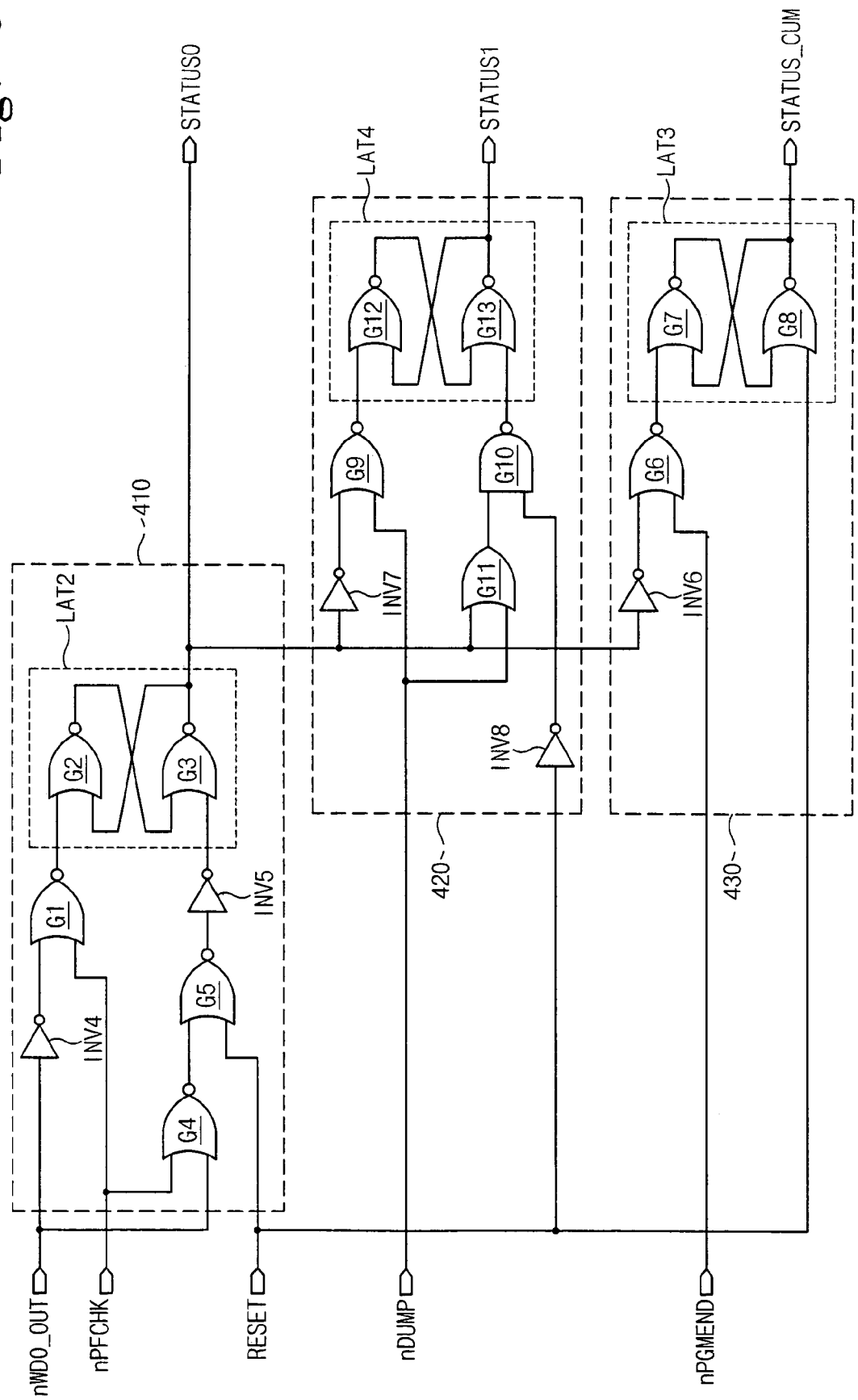
FIG. 6 is a schematic of the pass/fail check latch circuit of FIG. 4 according to some embodiments of the present invention.

FIG. 6 is a schematic of the pass/fail check latch circuit according to some embodiments of the present invention. The pass/fail check latch circuit 400 comprises a first check latch 410, a second check latch 420, and a third check latch 430.

The first check latch 410 receives a pass/fail check result about the present program page, that is, a page stored in the first register REG1 of each of the page buffer and then stores it. The second check latch 420 receives a pass/fail check result from the first check latch 410 when data is dumped from the second register REG2 of each of the page buffer to the first register REG1 by the control signal nDUMP and then stores it.

Still referring to FIG. 6, the first check latch 410 comprises an inverter IN4 for receiving an output signal nWD0_OUT of the pass/fail check circuit, a NOR gate G1 for receiving an output signal of the inverter IN4 and a control signal nPFCHK, a NOR gate G4 for receiving the output signal nWD0_OUT of the pass/fail check circuit and the control signal nPFCHK, a NOR gate G5 for receiving an output signal of the NOR gate G4 and a reset signal RESET, an inverter IN5 for receiving an output of the NOR gate G5, and a latch circuit LAT2 for receiving outputs of the NOR gate G1 and inverter IN5. The latch circuit LAT2 comprises two NOR gates G2 and G3.

The second check latch 420 comprises an inverter IN7 for receiving an output signal of the first check latch 410, a NOR gate G9 for receiving an output signal of the inverter IN7 and a control signal nDUMP, an OR gate G11 for receiving an output signal of the first check latch 410 and the control signal nDUMP, an inverter IN8 for receiving a reset signal RESET, a NAND gate G10 for receiving output signals of the OR gate G11 and the inverter IN8, and a latch circuit LAT4 for receiving output signals of the NOR gate G9 and the NAND gate G10. The latch circuit LAT4 comprises two NOR gates G12 and G13.

The third check latch 430 comprises an inverter IN6 for receiving an output signal of the first check latch, a NOR gate G6 for receiving an output signal of the inverter IN6 and a control signal nPGMEND, and a latch circuit LAT3 for receiving an output of the NOR gate G6 and a reset signal RESET. The latch circuit LAT3 comprises two NOR gates G7 and G8.

If the control signal nDUMP is applied, a pass/fail check result of the first selected page stored in the first check latch 410, that is, a status value STATUS0 is transferred to the second check latch 420. The first check latch 410 stores a pass/fail check result with respect to the second selected page.

Accordingly, the status value STATUS0 stored in the first check latch 410 corresponds to a program pass/fail check result value of a page to be programmed. A status value STATUS1 stored in the second check latch 420 corresponds to a program pass/fail check result value of a preceding page that had been just programmed.

Figure 7:
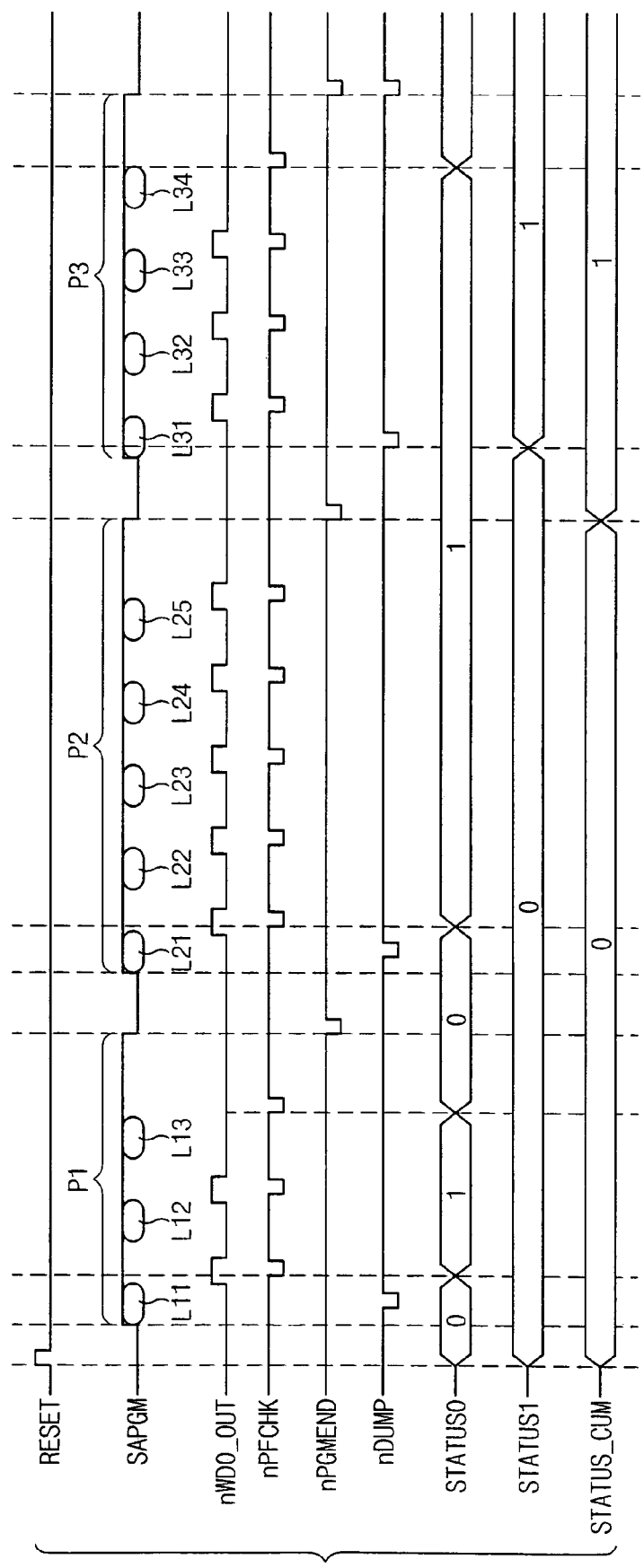
FIG. 7 is a timing diagram that illustrates programming operations for pages of memory cells in accordance with some embodiments of the present invention.

FIG. 7 is a timing diagram that illustrates three pages programmed in succession. Each of the pages is programmed by one program loop. In this case, if the page is not successfully programmed after checking a program state, a successive program loop is performed up to maximum five times.

Referring to FIG. 7, after a reset signal RESET is applied, a program of the first page is initiated. A first page section P1 corresponds to a program loop that is performed with respect to a first page selected in a page buffer circuit 200. A logic level of a signal nWD0_OUT transitions or maintains a former value according to whether a page is successfully programmed or not.

If a program operation is successfully performed after carrying out a verify operation, the signal nWD0_OUT is maintained in an existing state. If the program operation is not successfully performed, then the signal nWD0_OUT transitions to a high-pulse. In other words, if a program result of page data is "pass," then the signal nWD0_OUT is maintained at a low state logic level. If, however, the program result of the page data is "fail," then the signal nWD0_OUT transitions to a high pulse.

Every time each program loop of a selected page ends, the pass/fail check signal nPFCHK transitions to a low pulse. As a result of the pass/fail check, the signal nWD0_OUT is continuously stored in the first check latch 410.

Still referring to FIG. 7, after the first program loop L1 of the first page section P1 is performed, the pass/fail check signal nPFCHK transitions to a low pulse. At this time, the signal nWD0_OUT, as a result of the pass/fail check, transitions to a high pulse. This means that the program result with respect to the first page is "fail." The state value STATUS0 is a logic value of a register that stores a pass/fail state value of a page to be programmed.

As shown in FIG. 7, the state value STATUS0 is an output signal of the first pass/fail check latch circuit for receiving the reset signal, the pass/fail check signal nPFCHK, and the signal nWD0_OUT. If the signal nWD0_OUT is logically high when the pass/fail check signal nPFCHK transitions to a low pulse, then the state value STATUS0 is a "1," which means that the program result is "fail."

If the signal nWD0_OUT is logically low when the pass/fail check signal nPFCHK transitions to a low pulse, then the state value STATUS0 is a "0," which means that the program result is successful.

In the first page section P1, the program operation is not successfully performed after the first program loop L11 is carried out. As a result, the state value STATUS0 is "1." After the second program loop L12 is performed, the signal nWD0_OUT transitions to a high pulse to be logically high. Therefore, the program operation remains in a "fall" state, and the state value STATUS0 remains "1."

After third program loop L13 of the first page section P1 is performed, the state value STATUS0 is logically low meaning that the program is successfully performed when the pass/fail check signal nPFCHK is applied. Accordingly, the state value STATUS0 is "0," which means that the program is successfully performed.

If the program of the first page is successfully performed by performing the third program loop L13 in the first page section P1, then a program end signal nPGMEND transitions to a low pulse. As a result, the program of the first page ends.

If the program end signal nPGMEND transitions to a low pulse, then the third check latch checks the state value STATUS0 for the result of the first pass/fail check of a first selected page stored in the first check latch to determine whether the state value STATUS0 is "1" or not.

If a program of a second page is initiated, and the control signal nDUMP transitions to a low pulse "0" the pass/fail result of the first page stored in the first check latch is transferred to the second check latch and the first check latch circuit stores a pass/fail result of the second page to be programmed in the second page section P2.

Referring to FIG. 7, after the program of the first page ends, the program of the second page is initiated. The second page section P2 is a section where a program loop with respect to the second page selected from the page buffer circuit is performed.

In the second page section P2, each program loop is performed and a verify read operation is repeatedly performed to verify whether the program is successfully performed or not. If the program is not successfully performed, then the signal nWD0_OUT transitions to a high pulse. If, however, the program is successfully performed, then the signal nWD0_OUT is maintained logically low.

In the same way as the first section P1, every time the program loop ends the pass/fail check signal nPGMEND transitions to a low pulse to check whether the program is successfully performed. In addition, the pass/fail check signal nPGMEND and the signal nWD0_OUT are input to the first pass/fail check circuit. The pass/fail check signal nPGMEND transitions to a low pulse, the signal nWD0_OUT transitions to a high pulse, the state value STATUS0 being an output value of the first pass/fail check circuit has a "1," which means that the program was not successfully performed.

After five program loops L21, L22, L23, L24 and L25 are performed, the signal nWD0_OUT transitions to a high pulse, and the state value STATUS0 remains "1" in the second page section P2. Accordingly, the program operation with respect to the second page is not successfully performed and then the program with respect to the third page is initiated.

If the program is not successfully performed after the program loop is performed five times in the second page section P2, after a predetermined time, the program end signal nPGMEND transitions to a low pulse, and then the program operation with respect to the second page ends.

A state value STATUS_CUM changes at a point of time when the program end signal nPGMEND is applied. As shown in FIG. 7, the state value STATUS_CUM is an output signal of the second check latch, which receives the reset signal, the state value STATUS0, and the signal nPGMEND. If the program end signal nPGMEND transitions to a low pulse, the state value STATUS_CUM stores "1" or "0" depending on the state value STATUS0.

In FIG. 7, when the program of the second page section P2 is ended by the program end signal nPGMEND, the state value STATUS0 is maintained at "1." And, when the program end signal nPGMEND transitions to a low pulse, the state value STATUS_CUM changes from "0" to "1."

In particular, the state value STATUS_CUM remains "1" and is not changed irrespective of a variation of the state value STATUS0. In other words, if one of all pages to be programmed is not successfully programmed until the next reset signal is applied, the state value STATUS_CUM stores "1," which means the program is not successful until the next reset signal is applied because the program end signal nPGMEND with respect to a page that is not successfully programmed transitions to a low pulse.

Referring to FIG. 7, after a program of the second page ends in a "fail" state, a program with respect to the third page is initiated in the third page section P3. If the program of the third page is initiated, and the control signal nDUMP transitions to a low pulse, a high logic value "1," which is a pass/fail result of the first page stored in the first check latch, is transferred to the second check latch. The first check latch stores a pass/fail result of the second page that is programmed in the third page section P3.

As shown in FIG. 7, after the first program loop L31 of the third page section P3 is performed, the pass/fail check signal nPFCHK transitions to a low pulse. At the same time, the result signal NWD0_OUT transitions to a high pulse. This means that a program operation with respect to the third page has not been successfully performed.

After the second and third program loops L32 and L33 are performed, the signal nWD0_OUT transitions to be logically high. Accordingly, it is possible to verify that the program status is "fail" and status value STATUS_0 is maintained at "1."

After the fourth program loop L34 in the third page section P3, the signal nWD0_OUT is maintained logically low, which means that the program operation has been successful when the pass/fail check signal nPFCHK is applied. As a result, the status value STATUS_0 is "0," which means the program operation has been successfully performed.

After the program operation with respect to the third page, which is performed by performing the fourth program loop L34 in the third page section P3, the program with respect to the first page is ended by applying the program end signal nPGMEND as a predetermined recovery time is passed.

As mentioned above, the status value STATUS_CUM is maintained as "1" irrespective of a variation of the status value STATUS_0. In addition, only when the reset signal RESET is applied with a high pulse after all program operations with respect to successive pages are ended will the status value STATUS_CUM be changed.

As previously mentioned, it is possible to check whether several pages are successfully programmed after programming them using an output value of a check latch. In particular, while embodiments of the present invention have been described in connection with a semiconductor memory device equipped with a page buffer with a dual register, some embodiments of the present invention are applicable to a semiconductor memory device having a page buffer with a single register. If embodiments of the present invention are applied to a semiconductor memory device having a single register, then the pass/fail check circuit of FIG. 6 may comprise only first and second latch circuits and the third latch circuit may not be used.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A non-volatile semiconductor memory device, comprising:
    a cell array comprising a plurality of memory cells arranged in a plurality of rows and columns;
    a page buffer circuit comprising a plurality of page buffers corresponding to the plurality of columns, respectively, each page buffer comprising a first register that is configured to store programming data for a page memory cells and a second register that is configured to store contents of the first register and outside input data;
    a pass/fail check circuit that is configured to generate a programming verification result for the pages of memory cells responsive to the contents of the first registers; and
    a pass/fail check latch circuit that is configured to store the programming verification result, comprising:
    a first check latch configured to store the pronmniing verification result with respect to k-numbered page of memory cells (where, k=1, 2 . . . , n);
    a second check latch configured to store the programming verification result with respect to the k-1 numbered page of memory cells; and
    a third check latch that is configured to detect whether a page has been unsuccessfully programmed based on the programming verification result for that page stored in the first check latch, wherein if a page has been detected as having been unsuccessfully programmed once, then the third check latch maintains a "fail" state value until a successful program operation is performed with respect to all n pages.

2. The nonvolatile semiconductor memory device as set forth in claim 1, wherein each of the page buffers further comprises an insulated switch for selectively isolating the first and second registers, and wherein each of the first and second registers comprises:
    a latch configured to store data; and
    a precharge circuit configured to precharge the register.

3. The nonvolatile semiconductor memory device as set forth in claim 1, wherein the first check latch comprises:
    a first inverter configured to receive an output signal of the pass/fail check circuit;
    a first NOR gate configured to receive an output signal of the first inverter and a control signal;
    a second NOR gate configured to receive the output signal of the pass/fail check circuit and the control signal;
    a third NOR gate configured to receive an output signal of the second NOR gate and a reset signal;
    a second inverter configured to receive an output of the third NOR gate; and
    a latch circuit configured to receive outputs of the first NOR gate and the second inverter.

4. The nonvolatile semiconductor memory device as set forth in claim 3, wherein the latch circuit comprises two cross-coupled NOR gates.

5. The nonvolatile semiconductor memory device as set forth in claim 1, wherein the second check latch comprises:
    a first inverter configured to receive an output signal of the first check latch;
    a first NOR gate configured to receive an output signal of the first inverter and a control signal;
    a OR gate configured to receive an output signal of the first check latch and the control signal;
    a second inverter configured to receive a reset signal; a NAND gate configured to receive output signals of the OR gate and the second inverter; and
    a latch circuit configured to receive outputs of the NOR gate and the NAND gates.

6. The nonvolatile semiconductor memory device as set forth in claim 5, wherein the latch circuit comprises two cross-coupled NOR gates.

7. The nonvolatile semiconductor memory device as set forth in claim 1, wherein the third check latch comprises:
    an inverter configured to receive an output signal of the first check latch;
    a NOR gate configured to receive an output signal of the inverter and a control signal; and
    a latch circuit configured to receive an output of the NOR gate and the reset signal.

8. The nonvolatile memory device as set forth in claim 7, wherein the latch circuit comprises two cross-coupled NOR gates.

9. A non-volatile semiconductor memory device, comprising:
    a cell array comprising a plurality of memory cells arranged in a plurality of rows and columns;
    a page buffer circuit comprising a plurality of page buffers corresponding to the plurality of columns, respectively, each page buffer comprising a first register that is configured to store programming data for a page memory cells;
    a pass/fail check circuit that is configured to generate a programming verification result for the pages of memory cells responsive to the contents of the first registers; and a pass/fail check latch circuit tat is configured to store a result of whether n of the plurality of pages have been successfully programmed based on the programming verification result, comprising, a first check latch configured to store the programming verification result with respect to k-numbered page of memory cells (where, k=1, 2 . . . , n); and a second check latch that is configured to detect whether a page has been unsuccessfully programmed based on the in programming verification result for that page stored in the first check latch, wherein if a page has been detected as having been unsuccessfully programmed once, then the third check latch maintains a "fail" state value until a successful program operation is performed with respect to all n pages.

10. The nonvolatile semiconductor memory device as set forth in claim 9, wherein each page buffer further comprises a second register that is configured to store contents of the first register and outside input data, and each of the page buffers further comprises an insulated switch for selectively isolating the first and second registers, and wherein each of the first and second registers comprises:

a latch configured to store data; and a precharge circuit configured to precharge the register.

11. The nonvolatile semiconductor memory device as set forth in claim 9, wherein the first check latch comprises:

a first inverter configured to receive an output signal of the pass/fail check circuit;

a first NOR gate configured to receive an output signal of the first inverter and a control signal;

a second NOR gate configured to receive the output signal of the pass/fail check circuit and the control signal;

a third NOR gate configured to receive an output signal of the second NOR gate and a reset signal;

a second inverter configured to receive an output of the third NOR gate; and a latch circuit configured to receive outputs of the first NOR gate and the second inverter.

12. The nonvolatile semiconductor memory device as set forth in claim 11, wherein the latch circuit comprises two cross-coupled NOR gates.

13. The nonvolatile semiconductor memory device as set forth in claim 9, wherein the second check latch comprises:

an inverter configured to receive an output signal of the first check latch;

a NOR gate configured to receive an output signal of the inverter and a control signal; and a latch circuit configured to receive an output of the NOR gate and the reset signal.

14. The nonvolatile semiconductor memory device as set forth in claim 13, wherein the latch circuit comprises two cross-coupled NOR gates.

* * * * *

UNITED STATES PATENT AND TRADEMARK OFFICE
CERTIFICATE OF CORRECTION

PATENT NO. : 7,180,783 B2 Page 1 of 1
APPLICATION NO. : 11/025859
DATED : February 20, 2007
INVENTOR(S) : Kim et al.

It is certified that error appears in the above-identified patent and that said Letters Patent is hereby corrected as shown below:

On The Title Page:

Item [74], Please Correct to read --Myers Bigel Sibley & Sajovec, P.A.--

Column 9,

Line 57, Please Correct "pronmniing" to read --programming--

Line 58, Please Correct "2..., n" to read --2,..., n--

Column 10,

Line 40, Please Correct "NAND gates." To read --NAND gate. --

Column 11,

Line 1, Please Correct "tat" to read --that--

Line 7, Please Correct "2..., n" to read --2,..., n--

Line 10, Please Remove the word "in"

Signed and Sealed this

Eighth Day of May, 2007

JON W. DUDAS
*Director of the United States Patent and Trademark Office*